United States Patent
Skloss

(10) Patent No.: US 6,791,327 B2
(45) Date of Patent: Sep. 14, 2004

(54) METHOD FOR REDUCING SPIN-LATTICE RELAXATION TIME OF SILICONE FLUIDS USED IN MAGNETIC RESONANCE IMAGING

(75) Inventor: Timothy W. Skloss, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/324,578

(22) Filed: Dec. 19, 2002

(65) Prior Publication Data

US 2004/0119474 A1 Jun. 24, 2004

(51) Int. Cl.[7] .................................................. G01V 3/00
(52) U.S. Cl. ....................................................... 324/318
(58) Field of Search ................................. 324/307–309, 324/318; 600/410; 436/8; 73/1.86

(56) References Cited

U.S. PATENT DOCUMENTS

| | | | | |
|---|---|---|---|---|
| 4,700,136 A | * | 10/1987 | Yamaguchi et al. | 324/309 |
| 4,719,406 A | * | 1/1988 | Schaefer et al. | 324/318 |
| 5,296,809 A | * | 3/1994 | Roberts et al. | 324/309 |
| 5,312,755 A | * | 5/1994 | Madsen et al. | 436/8 |
| 5,770,943 A | * | 6/1998 | Zhou | 324/307 |
| 6,318,146 B1 | * | 11/2001 | Madsen et al. | 73/1.86 |
| 6,380,741 B1 | * | 4/2002 | Hajnal et al. | 324/318 |
| 6,605,942 B1 | * | 8/2003 | Warren | 324/307 |
| 6,635,486 B2 | * | 10/2003 | Madsen et al. | 436/8 |
| 6,720,766 B2 | * | 4/2004 | Parker et al. | 324/308 |

* cited by examiner

*Primary Examiner*—Christopher W. Fulton
*Assistant Examiner*—Dixomara Vargas
(74) *Attorney, Agent, or Firm*—Michael Della Penna

(57) ABSTRACT

A method for reducing the calibration time of magnetic imaging resonance systems at fields of 1 Tesla or higher utilizing silicone oil type phantom tanks. A small amount of a non-ionic paramagnetic compound such as gadolinium beta-diketonate (a common metallocomplex) is added to the silicone oil to reduce the spin-lattice relaxation time of the silicone oil in magnetic resonance phantoms. The amount of reduction of the spin lattice relaxation time is inversely proportional to the amount of paramagnetic compound added to the silicone oil in a given phantom tank and thus can be controlled in a precise manner.

17 Claims, 2 Drawing Sheets

METHOD FOR REDUCING SPIN-LATTICE RELAXATION TIME OF SILICONE FLUIDS USED IN MAGNETIC RESONANCE IMAGING

TECHNICAL FIELD

The present invention relates generally to magnetic resonance imaging systems and more particularly to a method for reducing spin-lattice relaxation time of silicone fluids used in magnetic resonance imaging.

BACKGROUND ART

The invention is suitable for use with Nuclear Magnetic Resonance (NMR) techniques, and in particular, although not exclusively, with Magnetic Resonance Imaging (MRI) techniques, but may also be used in Nuclear Quadruple Resonance, Electron Spin Resonance, and other such techniques.

NMR is a technique in which a radio frequency (RF) excitation pulse is applied to a sample in the presence of a magnetic field, and echoes or other signals resulting from the excitation of atomic nuclei with net magnetic moments in the sample are subsequently detected. Hydrogen, whose nuclei are essentially single protons, are the nuclei most commonly probed by MR due to their high abundance in water and fat and their relatively high receptivity (signal amplitude) to the MR experiment. In MRI, the magnitudes of the echo signals are used to construct an image. The concentration of hydrogen atoms will generally correspond to the water and/or fat density in the sample. MRI is therefore widely used for imaging tissue in the human body.

The echo signals will have various parameters associated with them, such as the spin-lattice relaxation time, $T_1$ and the spin-spin relaxation time, $T_2$. These parameters are properties that are inherent to the material being sampled. The relaxation parameters $T_1$ and $T_2$ are often used to provide contrast in images, because the typical variation in these parameters may be much larger than that in straightforward proton density. For example, the difference in the proton concentration between normal and abnormal tissue in the human body may only be a few percent, while the difference between the relaxation parameters may be much higher. Grey and white areas in the brain also have very different $T_1$ and $T_2$ values.

It is common practice in the industry to utilize phantoms to calibrate the MRI machines between uses. The phantoms are generally shatterproof tanks which contain a liquid filler material. The phantom is positioned inside a head coil on top of a gray foam positioner. The positioner is mounted onto the patient bed that slides in and out of the magnetic bore. The shape of the tank and the composition of the filler material are specifically calibrated to produce a specific pattern of MR signals which are used to ensure the accuracy of the MRI machine.

Poly(dimethylsiloxane) fluid, commonly called silicone oil or silicone fluid, is a very useful non-toxic phantom filler for magnetic resonance. These fluids are non-electrically conductive and have a low dielectric constant which greatly reduces interferences with the RF fields emitted by the MRI system's RF coils compared to water-based phantom filler materials. Silicone fluids also have self-diffusion characteristics advantageous for calibrating diffusion weighted imaging sequences.

A key disadvantage with the use of silicone oils in MR phantoms is in its excessively long $T_1$ time. This is especially disadvantageous when used in MRI systems operating at main magnetic fields of 1 Tesla or greater.

SUMMARY OF THE INVENTION

The present invention proposes dissolving a relatively small amount of gadolinium beta-diketonate (a common metallocomplex) in the silicone oil to greatly reduce the spin-lattice relaxation time of the silicone oil used in phantom fillers.

Other objects and advantages of the present invention will become apparent upon the following detailed description and appended claims, and upon reference to the accompanying drawings.

DETAILED DESCRIPTION OF THE INVENTION

Figure 1:
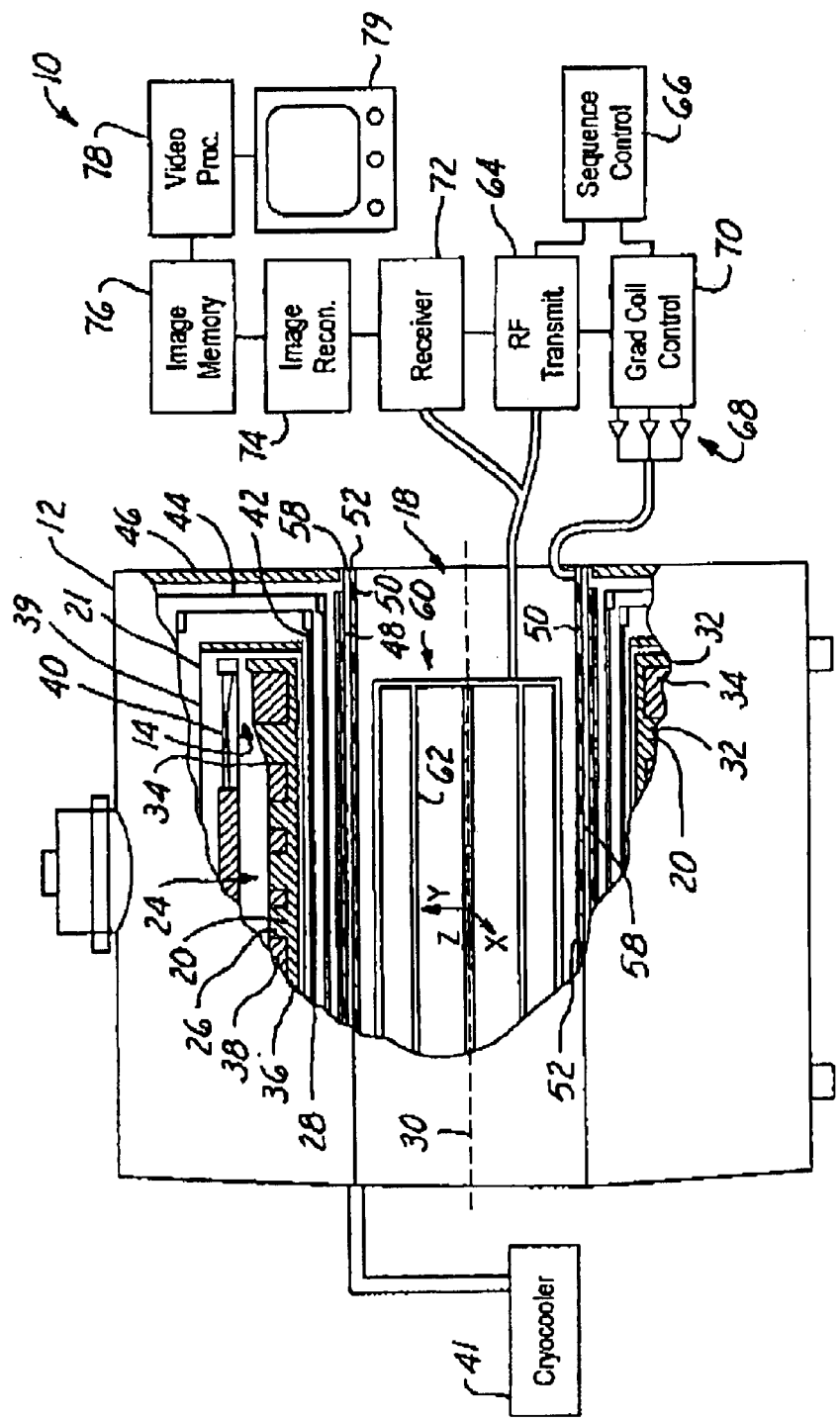
FIG. 1 is a top and partial section view of an imaging system.

In each of the following figures, the same reference numerals are used to refer to the same components. While the present invention is described with respect to a method and apparatus for simulating and determining field instabilities within a MRI system, the present invention may be adapted to simulate field instability within various systems including: MRI systems, magnetic resonance spectroscopy systems, and other applications where field instability is an issue in the design of system components.

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient magnet assembly, a cryostat, a cryocooler, a cryostat support structure, or any other MRI system component known in the art.

Referring now to FIG. 1, a block diagrammatic view of a MRI system 10 is shown. The MRI system 10 includes a static magnet structure 12 comprising a superconducting magnet 14 having a plurality of superconducting magnetic field coils 38 which generate a temporally constant magnetic field along a longitudinal z-axis of a patient bore 18. The superconducting magnet coils 38 are supported by a superconducting magnet coil support structure 20 and received in a cryostat 21.

The superconducting magnet coil support structure 20 provides support for static loads and allows fabrication and accurate placement of coils 38. Only one superconducting magnet 14 and one superconducting magnet coil support structure 20 are shown, however, the disclosed system may have multiple superconducting magnets and superconducting magnet coil support structures.

The superconducting magnet coil support structure 20 is preferably a solid body and includes an exterior side 24, an exterior portion 26, and an interior side 28. The exterior side 24 is the longitudinal side farthest away from the center 30 of the patient bore 18 that supports the superconducting magnet 14. The exterior side 24 has a plurality of shoulders 32 and a plurality of pockets 34. The plurality of shoulders 32 and the plurality of pockets 34 have dimensions corresponding to dimensions of the superconducting magnet 14. The interior portion 26 is the solid body of the superconducting magnet coil support structure 20. The interior portion 26 has a base 36. The plurality of shoulders 32 are integrally connected to the external side 38 of the base 36. The interior side 28 is preferably cylindrical shaped and is the side closest to the center 30 of the patient bore 18.

Cryostat 21 includes toroidal helium vessel 39 and main magnetic field shield coil assembly 40. The cryostat 21 is coupled to a cryocooler 41. The cryocooler 41 maintains the helium vessel 39 at proper operating temperatures.

The main magnetic field shield coil assembly 40 generates a magnetic field that opposes the field generated by the superconducting magnet coils 38. A first coil shield 42 surrounds the helium vessel 39 to reduce "boil-off". A second coil shield 44 surrounds the first coil shield 42. Both the first coil shield 42 and the second coil shield 44 are preferably cooled by mechanical refrigeration. The first coil shield 42 and the second coil shield 44 encases a toroidal vacuum vessel 46. The toroidal vacuum vessel 46 comprises a cylindrical member 48 that defines the patient bore 18 and extends parallel to a longitudinal axis. On a first exterior side 50 of the cylindrical member 48, which is longitudinal side farthest away from the center 30, of the patient bore 18 is a magnetic gradient coil assembly 52. Located on a second exterior side of the magnetic gradient coil assembly 52 is a cylindrical dielectric former. A RF shield 58 is applied to the cylindrical dielectric former.

The patient bore 18 has a RF coil assembly 60 (antennae) mounted therein. The RF coil assembly 60 includes a primary RF coil 62 and the RF shield 58.

A RF transmitter 64 is connected to a sequence controller 66 and the primary RF coil 62. The RF transmitter 64 is preferably digital. The sequence controller 66 controls a series of current pulse generators 68 via a gradient coil controller 70 that is connected to the magnetic gradient coil assembly 52. The RF transmitter 64 in conjunction with the sequence controller 66 generates pulses of radio frequency signals for exciting and manipulating magnetic resonance in selected dipoles of a portion of the subject within the patient bore 18.

A radio frequency receiver 72 is connected with the primary RF coil 62 for demodulating magnetic resonance signals emanating from an examined portion of the subject. An image reconstruction apparatus 74 reconstructs the received magnetic resonance signals into an electronic image representation that is stored in an image memory 76. A video processor 78 converts stored electronic images into an appropriate format for display on a video monitor 79.

Figure 2:
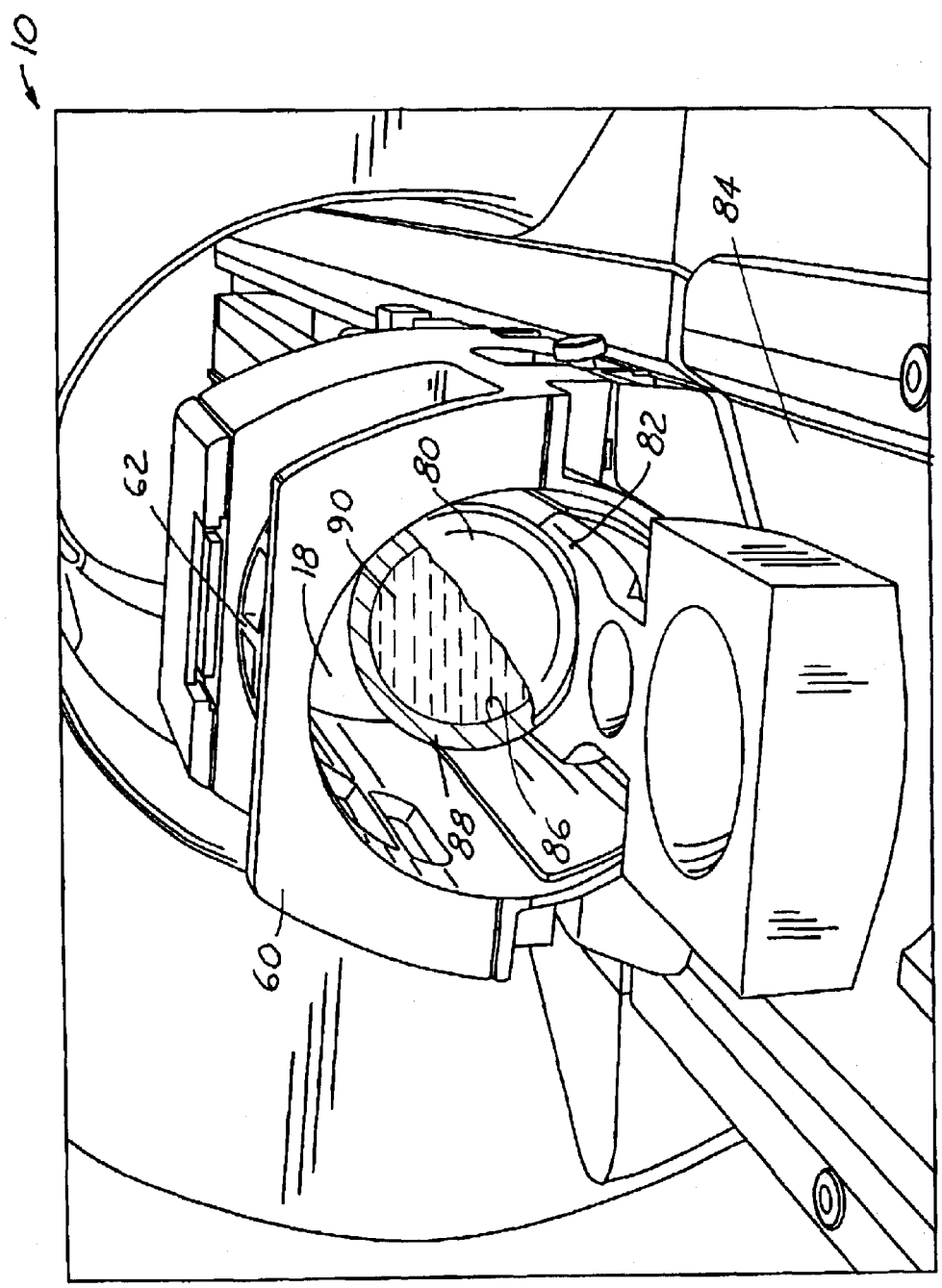
FIG. 2 is a perspective view of a phantom tank used to calibrate the imaging system of FIG. 1.

To ensure the accuracy of the images created using the MRI system 10, it is necessary to periodically calibrate the system. As best shown in FIG. 2, this is accomplished by placing a phantom tank 80 inside the primary RF coil 62 sitting of a gray foam positioner 82. The primary RF coil 62 is mounted onto a patient bed 84 which slides in and out of the patient bore 18.

The phantom tank 80 has hollow inner region 86 contained within an outer structure 88. The outer structure 88 is made of a shatterproof material such as a thermosetting polymer or a fiber-reinforced thermosetting polymer.

The inner hollow region 86 is filled with a liquid filler material 90. The size and shape of the outer structure 88 and inner region 86, as well as the composition of the liquid filler material 90, produce a distinctive echo signal when RF excitation pulses are applied to the tank 80. These echo signals produce a distinctive image that is compared to a reference image to calibrate the MRI machine 10 in a manner well known in the art.

Typically, the composition of the liquid filler materials used in MRI systems of the prior art have consisted primarily of water-based and pure silicone oil (poly(dimethylsiloxane)) fluids. The requirement that silicone oils be used exclusively in 3.0 Tesla (T) and higher systems has dramatically increased the time required for system calibration because silicone oil in phantom tanks has an excessively long spin-lattice relaxation time ($T_1$). The relaxation time usually dictates the pulse repetition rate and therefore increases the time required to complete the scan.

The present invention contemplates introducing a small amount of dopant material to the silicone oil to reduce the spin lattice relaxation time ($T_1$) of the filler material 90 as compared to a filler material of the prior art that consist essentially of pure silicone oil. This allows the phantom tank 80 to be used to calibrate MRI systems 10 at fields greater than 1 Tesla, including 1.5 and 3.0 T. The composition of the liquid filler material 90 of the present invention is a non-toxic and non-conductive fluid that does not interfere with the RF field emitted by the MRI systems RF coils.

The dopant material that constitutes a small amount of the filler material 90 according to the preferred embodiment of the present invention is preferably a non-ionic paramagnetic compound that can be dissolved in silicone oil. One preferred class of paramagnetic compounds is gadolinium beta-diketonate compounds. Two preferred gadolinium beta-diketonates compounds are gadolinium tris(6,6,7,7,8,8,8-hepta-fluoro-2,2-dimethly-3,5-octanedionate) (Gd(fod)$_3$) and gadolinium tris(2,2,6,6-tetramethyl-3,5-heptanedionate) (Gd(tmdh)$_3$) having chemical compositions as shown below:

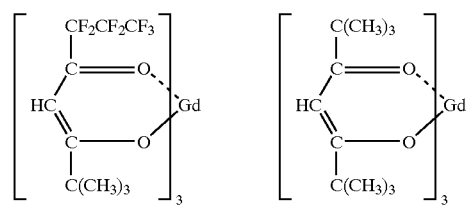

The gadolinium beta-diketonates compounds have good solubility in silicone oil. The filler material 90 is made by introducing one of the gadolinium beta-diketonates compounds to the silicone oil under vigorous stirring and/or gentle heating (preferably up to about 140 degrees Celsius). This results in the dissolution of the beta-diketonates compound into the silicone oil to form the filler material 90. This is preferably done prior to introducing the filler material 90 within the hollow inner region 86, however it is possible to dissolve the gadolinium beta-diketonates compounds to the silicone oil within the phantom tank 80.

The concentration of dopant ([Gdx]), measured in parts per thousand, is inversely proportional to the resulting filler's $T_1$ (measured in milliseconds) according to the general equation:

$$[Gdx] = A_1/T_1 - A_2$$

where the coefficients $A_1$ and $A_2$ are dependent on field strength, dopant compound and oil viscosity. Table 1 below provides the coefficients $A_1$ and $A_2$ at 1.5 Tesla and 3.0 Tesla for Gd(fod)3 dissolved in GE SF/96-50 silicone fluid (viscosity 50 centistokes).

TABLE 1

| Coefficient | 1.5 Tesla | 3.0 Tesla |
| --- | --- | --- |
| $A_1$ | 168.6 | 274.2 |
| $A_2$ | 0.2162 | 0.2779 |

Thus, for example, at 1.5 Tesla, a liquid filler material made with pure silicone oil has a spin relaxation time of about 779.8 milliseconds. As one of skill in the art would appreciate, the addition of just 1 part per thousand non-ionic paramagnetic compound dopant material results in a spin lattice relaxation time of about 131.9 seconds, corresponding to about a 83 percent reduction as compared with pure silicone oil.

Similarly, at 3.0 Tesla, a liquid filler material made with pure silicone oil has a spin relaxation time of about 986.7 milliseconds. The addition of just 1 part per thousand non-ionic paramagnetic compound dopant material to the filler material results in a spin lattice relaxation time of about 214.6 seconds, corresponding to about a 78 percent reduction in spin lattice relaxation time.

The addition of relatively small amounts of non-ionic paramagnetic compounds such as gadolinium beta-diketonates thus allows the use of phantoms 80 having primarily silicone oil liquid filler materials 90 to be used to calibrate an MRI system 10 for magnetic resonance at fields greater than 1 Tesla.

While one particular embodiment of the invention have been shown and described, numerous variations and alternative embodiments will occur to those skilled in the art. Accordingly, it is intended that the invention be limited only in terms of the appended claims.

What is claimed is:

1. A phantom tank used for calibrating magnetic resonance imaging systems at fields greater than 1 Tesla comprising:
   an outer structure having an inner hollow region; and
   a liquid filler material contained within said inner hollow region, said liquid filler material comprised of a first amount of silicone oil and a second amount of a dopant material, said dopant material used to reduce the spin lattice relaxation time of said first amount of silicone oil, wherein said dopant material comprises a non-ionic paramagnetic compound.

2. The phantom tank of claim 1, wherein said non-ionic paramagnetic compound comprises a gadolinium beta-diketonate compound.

3. The phantom tank of claim 2, wherein said gadolinium beta-diketonate compound comprises gadolinium tris(6,6,7,7,8,8,8-hepta-fluoro-2,2-dimethly-3,5-octanedionate).

4. The phantom tank of claim 2, wherein said gadolinium beta-diketonate compound comprises gadolinium tris(2,2,6,6-tetramethyl-3,5-heptanedionate).

5. The phantom tank of claim 1, wherein said second amount is inversely proportional to the decrease in spin lattice relaxation time of said liquid filler material.

6. A liquid filler material contained within a inner hollow region of a phantom tank used to calibrate magnetic imaging resonance systems having resonance of 1 Tesla or greater, said liquid filler material comprising:
   a first amount of silicone oil; and
   a second amount of a dopant material, said dopant material used to reduce the spin lattice relaxation time of said first amount of silicone oil, wherein said dopant material comprises a non-ionic paramagnetic compound.

7. The liquid filler material of claim 6, wherein said non-ionic paramagnetic compound comprises a gadolinium beta-diketonate compound.

8. The liquid filler material of claim 7, wherein said gadolinium beta-diketonate compound comprises gadolinium tris(6,6,7,7,8,8,8-hepta-fluoro-2,2-dimethly-3,5-octanedionate).

9. The liquid filler material of claim 7, wherein said gadolinium beta-diketonate compound comprises gadolinium tris(2,2,6,6-tetramethyl-3,5-heptanedionate).

10. The liquid filler material of claim 6, wherein said second amount is inversely proportional to the decrease in spin lattice relaxation time of said liquid filler material.

11. A method for reducing the calibration time of a magnetic imaging resonance system at resonance of 1 Tesla or comprising:
   providing a phantom tank having an outer structure and a inner hollow region, said inner hollow region having a quantity of a silicone oil liquid filler material;
   introducing a small amount of a non-ionic paramagnetic material to said silicone oil liquid filler material to form a liquid filler material, said liquid filler material having a lower spin lattice relaxation time than said silicone oil liquid filler material.

12. The method of claim 11, wherein introducing a small amount of a non-ionic paramagnetic material comprises introducing a small amount of a gadolinium beta-diketonate compound to said silicone oil liquid filler material to form a liquid filler material, said liquid filler material having a lower spin lattice relaxation time than said silicone oil liquid filler material.

13. The method of claim 12, wherein introducing a small amount of a gadolinium beta-diketonate compound comprises introducing a small amount of a gadolinium beta-diketonate compound to said silicone oil liquid filler material to form a liquid filler material, said liquid filler material having a lower spin lattice relaxation time than said silicone oil liquid filler material, wherein said gadolinium beta-diketonate compound comprises gadolinium tris(6,6,7,7,8,8,8-hepta-fluoro-2,2-dimethly-3,5-octanedionate).

14. The method of claim 12, wherein introducing a small amount of a gadolinium beta-diketonate compound comprises introducing a small amount of a gadolinium beta-diketonate compound to said silicone oil liquid filler material to form a liquid filler material, said liquid filler material having a lower spin lattice relaxation time than said silicone oil liquid filler material, wherein said gadolinium beta-diketonate compound comprises gadolinium tris(2,2,6,6-tetramethyl-3,5-heptanedionate).

15. The method of claim 11, introducing a small amount of a non-ionic paramagnetic material comprises:
   introducing a small amount of a non-ionic paramagnetic material to said silicone oil liquid filler material;
   gently heating said small amount of non-ionic paramagnetic material and said quantity of silicone oil to a temperature sufficient to dissolve said small amount of said non-ionic paramagnetic material within said quantity of silicone oil to form a liquid filler material; and
   introducing said liquid filler material within a hollow inner region of a phantom tank.

16. The method of claim 11, wherein introducing a small amount of a non-ionic paramagnetic material to said silicone oil liquid filler material comprises:
   dissolving a small amount of a non-ionic pararmagnetic material within said silicone oil liquid filler material to form a liquid filler material, said liquid filler material having a lower spin lattice relaxation time than said silicone oil liquid filler material.

17. The method of claim 11, wherein introducing a small amount of a non-ionic paramagnetic material to said silicone oil liquid filler material comprises:

determining a desired spin lattice relaxation time for the magnetic image resonance system having a liquid filler material contained within a phantom tank having a predetermined size and a predetermined shape;

determining an amount of a non-ionic paramagnetic material to introduce to a quantity of silicone oil liquid filler material to achieve said desired spin lattice relaxation time; and introducing said amount of non-ionic paramagnetic material to said quantity of silicone liquid filler material to form a liquid filler material.

* * * * *